US010878854B2

(12) United States Patent
Pan et al.

(10) Patent No.: US 10,878,854 B2
(45) Date of Patent: Dec. 29, 2020

(54) VOLTAGE GENERATION CIRCUIT

(71) Applicant: MICRON TECHNOLOGY, INC., Boise, ID (US)

(72) Inventors: Dong Pan, Boise, ID (US); Jun Wu, Jiangsu (CN)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/548,729

(22) Filed: Aug. 22, 2019

(65) Prior Publication Data
US 2019/0378547 A1 Dec. 12, 2019

Related U.S. Application Data

(63) Continuation of application No. 15/312,010, filed as application No. PCT/CN2016/087650 on Jun. 29, 2016, now Pat. No. 10,446,195.

(51) Int. Cl.
*G05F 3/02* (2006.01)
*G11C 11/16* (2006.01)
(Continued)

(52) U.S. Cl.
CPC ............. *G11C 5/147* (2013.01); *G05F 1/575* (2013.01); *G05F 1/595* (2013.01); *G11C 5/14* (2013.01);
(Continued)

(58) Field of Classification Search
CPC combination set(s) only.
See application file for complete search history.

(56) References Cited

U.S. PATENT DOCUMENTS 5,187,395 A 2/1993 Pirez
5,604,453 A 2/1997 Pedersen
(Continued)

FOREIGN PATENT DOCUMENTS

CN 86108332 A 11/1988
CN 101394152 A 3/2009
(Continued)

OTHER PUBLICATIONS

First Office Action for TW Application No. 106120028, dated Feb. 22, 2018.
(Continued)

*Primary Examiner* — An T Luu
(74) *Attorney, Agent, or Firm* — Dorsey & Whitney LLP

(57) ABSTRACT

Disclosed are apparatuses and methods for controlling gate-induced drain leakage current in a transistor device. An apparatus may include a first biasing circuit stage configured to provide a biasing voltage on a biasing signal line, the biasing voltage based on a current through a first resistor associated with the first biasing circuit stage, a voltage generation circuit stage coupled to the first biasing circuit stage, the voltage generation circuit stage having an output transistor that is coupled to the biasing signal line through a gate terminal of the output transistor, and an output line coupled to the voltage generation circuit stage and configured to provide an output voltage signal having a steady-state voltage that is less than a power supply voltage by an amount that corresponds to a voltage drop across the first resistor associated with the first biasing circuit stage.

20 Claims, 5 Drawing Sheets

(51) Int. Cl.
*G11C 5/14* (2006.01)
*H03K 3/012* (2006.01)
*G11C 29/02* (2006.01)
*G05F 1/575* (2006.01)
*G05F 1/595* (2006.01)

(52) U.S. Cl.
CPC .......... *G11C 29/021* (2013.01); *G11C 29/028* (2013.01)

(56) References Cited

U.S. PATENT DOCUMENTS

| | | | |
|---|---|---|---|
| 5,889,431 A | 3/1999 | Csanky | |
| 6,054,893 A * | 4/2000 | Singh | G11C 17/16 327/525 |
| 6,567,441 B2 | 5/2003 | Furudate et al. | |
| 6,750,697 B2 | 6/2004 | Bernardon | |
| 6,750,720 B1 | 6/2004 | Mori et al. | |
| 7,034,514 B2 | 4/2006 | Tachibana et al. | |
| 7,362,167 B2 * | 4/2008 | Park | G11C 5/14 327/543 |
| 7,579,821 B2 * | 8/2009 | Lee | G05F 3/242 323/313 |
| 7,639,066 B2 | 12/2009 | Harald | |
| 9,250,696 B2 | 2/2016 | Kumar et al. | |
| 9,473,127 B1 | 10/2016 | Azin | |
| 10,249,348 B2 | 4/2019 | Tanaka et al. | |
| 10,446,195 B2 * | 10/2019 | Pan | G11C 5/14 |
| 10,614,861 B2 | 4/2020 | Tanaka et al. | |
| 2004/0042317 A1 | 3/2004 | Marr et al. | |
| 2007/0069710 A1 | 3/2007 | Lee et al. | |
| 2007/0247931 A1 | 10/2007 | Kim | |
| 2008/0239834 A1 | 10/2008 | Tran et al. | |
| 2009/0140793 A1 | 6/2009 | Byeon | |
| 2010/0142288 A1 | 6/2010 | Kim | |
| 2010/0253419 A1 | 10/2010 | Ogai et al. | |
| 2014/0247087 A1 | 9/2014 | Bhattad et al. | |
| 2015/0229296 A1 | 8/2015 | Kim | |
| 2018/0226107 A1 | 8/2018 | Pan et al. | |
| 2019/0035434 A1 | 1/2019 | Tanaka et al. | |
| 2019/0180794 A1 | 6/2019 | Tanaka et al. | |
| 2019/0287576 A1 | 9/2019 | Tanaka et al. | |

FOREIGN PATENT DOCUMENTS

| | | |
|---|---|---|
| KR | 20020017393 A | 3/2002 |
| KR | 100650371 B1 | 11/2006 |
| WO | 20180000237 A1 | 1/2018 |

OTHER PUBLICATIONS

U.S. Appl. No. 16/435,197 entitled "Apparatuses and Methods for Generating a Voltage in a Memory"; filed Jun. 7, 2019.
International Preliminary Report on Patentability for PCT application No. PCT/CN2016/087650 dated Jan. 10, 2019.
Receipt of ISR/WO for application No. PCT/CN2016/087650 dated Apr. 1, 2017.
Extended European Search Report for EP Application No. 16906638, dated Dec. 6, 2019.
English translation of Notice of Reasons for Rejection for KR Application No. 10-2019-7000207, dated Apr. 27, 2020.

* cited by examiner

VOLTAGE GENERATION CIRCUIT

CROSS-REFERENCE TO RELATED APPLICATION(S)

CROSS-REFERENCE TO RELATED APPLICATION(S)

This application is a continuation of U.S. patent application Ser. No. 15/312,010, filed Nov. 17, 2016 and issued as U.S. Pat. No. 10,446,195 on Oct. 15, 2019, which is U.S. National Entry of PCT Patent Application No. PCT/CN2016/087650, filed Jun. 29, 2016. These applications and patent are incorporated by reference herein, in their entirety, and for any purposes.

TECHNICAL FIELD

The present disclosure is directed to systems and methods for generating a voltage.

BACKGROUND

Memory, such as dynamic random access memory (DRAM), is used in a multitude of electronics systems (e.g., portable computers, desktop computers, server systems, mobile devices, etc.) and has gone through several advancements over the years. For example, there are the following problems about a voltage supplied to a gate of a transistor. Gate-induced drain (GIDL) leakage may occur in certain semiconductor devices, such as field-effect transistors, which are components of memory devices. Gate-induced drain leakage current occurs when a voltage of a certain magnitude is present on the gate of the transistor that causes current to leak from the drain of the transistor through the substrate. This leakage current is generally referred to as a GIDL current. Memory devices may be designed to control this gate-induced drain leakage (GIDL) in order to enhance performance.

DETAILED DESCRIPTION

The present disclosure is generally directed to apparatuses and methods for generating a voltage. In one example, the present disclosure is directed to apparatuses and methods for controlling gate-induced drain leakage (GIDL) current in a transistor device. The transistor device may be arranged as a component of a memory, such as a dynamic random access memory (DRAM). The amount of GIDL current in a transistor device may be proportional to the gate-to-drain (Vgd) voltage of the transistor device. In one respect, GIDL current may be controlled by the voltage present on the transistor gate. Various embodiments are directed to circuits that generate a voltage (VGIDL) used to control a GIDL current. VGIDL circuit embodiments generate a VGIDL voltage that is provided as output to a downstream device such as a memory access circuit. The VGIDL voltage is received at the downstream component and provided as input to the gate of a transistor so as to control GIDL current in the transistor.

A VGIDL circuit in accordance with the present disclosure provides a VGIDL voltage, which is generally insensitive to variable circuit conditions such as may occur in designs having a temperature dependent power supply voltage, such as a pumped supply voltage (VCCP). A VGIDL circuit in accordance with the present disclosure is configured to have a strong pull-up and/or pull-down driving ability, which may not be present in previous structures. As a result, the circuit may have faster ramp up times during power up. A VGIDL circuit in accordance with the present disclosure may additionally have a maximum level that is not limited by transistor threshold voltages. More specifically, previous structures may have a maximum level of VCCP−Vt (where Vt is the threshold voltage of the transistor), which limitation is removed in present embodiments. Further, a VGIDL circuit in accordance with the present disclosure may be configured to have relatively small variation of the VGIDL voltage across temperature and processes corners. A VGIDL circuit in accordance with the present disclosure also maintains low VCCP bias current and low cross current.

Figure 1:
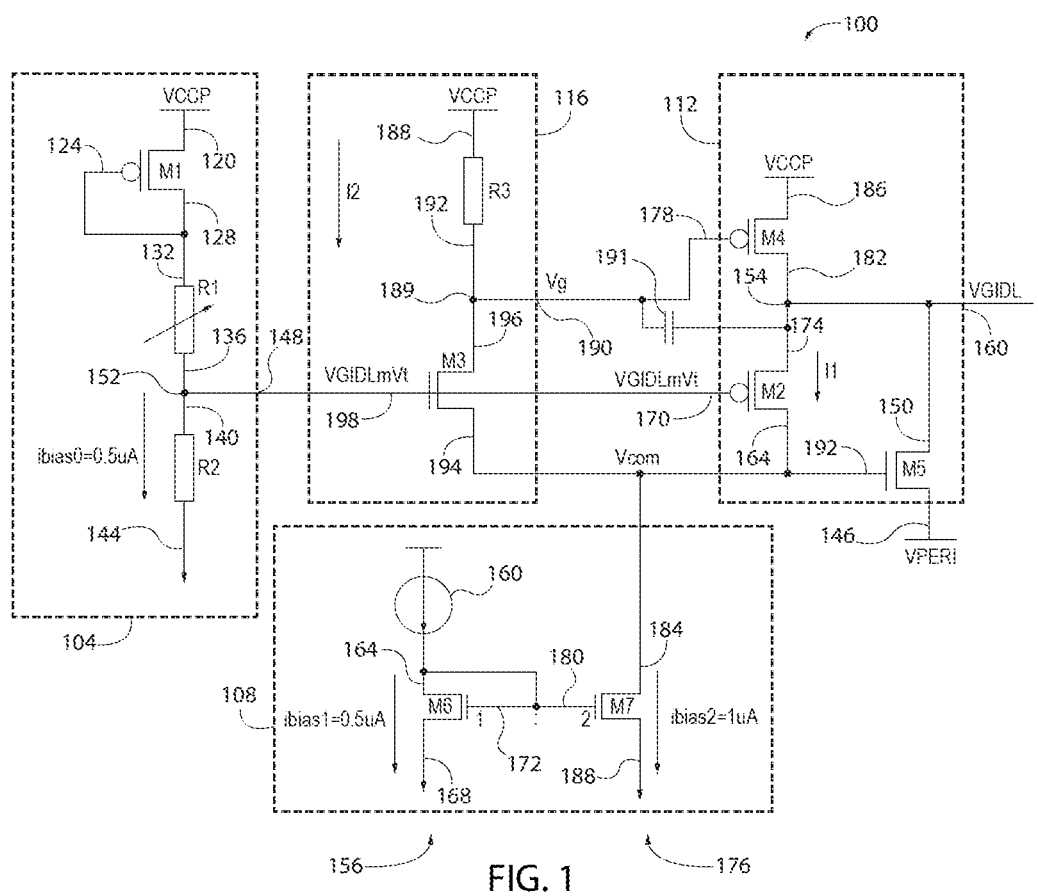
FIG. 1 is a schematic illustration of a VGIDL circuit in accordance with the present disclosure.

FIG. 1 is a schematic illustration of a VGIDL circuit 100. The VGIDL circuit 100 includes first and second biasing stages 104, 108 that are provided in association with a VGIDL generation stage 112. The VGIDL circuit 100 additionally includes a feedback stage 116 arranged between the first biasing stage 104 and the VGIDL generation stage 112. The first biasing stage 104 is generally configured to provide a biasing voltage VGIDLmVt, which is received as input by the VGIDL generation stage 112 and the feedback stage 116. The second biasing stage 108 is generally configured to sink biasing current from both the VGIDL generation stage 112 and the feedback stage 116. The second biasing stage 108 may be arranged to sink current through a voltage reference line (Vcom) that couples the feedback stage 116 to the VGIDL generation stage 112. In addition to the Vcom line, the feedback stage 116 and the VGIDL generation stage 112 are coupled through a gate voltage (Vg) line that provides output from the feedback stage 116 to VGIDL generation stage 112.

As shown in FIG. 1, the first biasing stage 104 may include a biasing transistor M1 coupled to first and second biasing resistors R1, R2. The M1 transistor may be a PMOS transistor in one example. The M1 transistor may be proximate to the power supply voltage such that a source terminal 120 of the M1 transistor is coupled to VCCP. A gate terminal 124 and a drain terminal 128 of the M1 transistor may be coupled together. The drain terminal 128 of the M1 transistor may be further coupled the R1 and R2 resistors, which may be arranged in a series configuration between the M1 transistor and ground. More specifically, the drain terminal 128 of the M1 transistor may be coupled to a first end 132 of the R1 resistor, a second end 136 of the R1 transistor may be coupled to a first end 140 of the R2 resistor, and a second end 144 of the R2 resistor may be coupled to ground.

As shown in FIG. 1, the first biasing stage 104 may provide a biasing voltage VGIDLmVt that is provided through an output 148 that is coupled to a circuit node 152 that couples the R1 and R2 resistors together. In accordance with various embodiments, one or both of the R1 and R2 resistors may be variable resistors. By way of example, a variable resistor may be device having a resistive component and an adjustment component such as a wiper or brush that sets an amount of resistive for the resistive component. In the embodiment shown in FIG. 1, the R1 resistor is a variable resistor by way of example and not limitation. As described in greater detail below, the biasing voltage VGIDLmVt and, in turn, the VGIDL voltage may be adjusted via adjustments to the variable resistor R1. The biasing current through the first biasing stage 104 is generally referred to herein as ibias0.

The second biasing stage 108 may be generally configured as a current mirror having a first branch 156 that copies the current present in the first biasing stage 104, A copy of the current present in the first biasing stage 104 is generally represented in FIG. 1 as a current source 160. The first branch 156 of the second biasing stage 108 additionally includes a transistor M6. The M6 transistor may be an NMOS transistor in one example. A drain terminal 164 of the M6 transistor is coupled to the current source 160 and a source terminal 168 is coupled to ground. The drain terminal 164 of the M6 transistor is additionally coupled to its gate terminal 172, which in turn is coupled to a second branch 176 of the second biasing stage 108.

The second branch 176 includes a transistor M7 having a gate terminal 180 that is coupled to the gate terminal 172 of the M6 transistor. The M7 transistor may be an NMOS transistors in one example. A drain terminal 184 of the M7 transistor is coupled to both the feedback stage 116 and the VGIDL generation stage 112 through the Vcom line. The second branch 176 generally provides twice the amount of current that is present in the first branch 156. The biasing current through the first branch 156 of the second biasing stage 108 is generally referred to herein as ibias1. The biasing current through the second branch 176 of the second biasing stage 108 is generally referred to herein as ibias2.

The feedback stage 116 may include a resistor R3 coupled in series to a transistor M3. The M3 transistor may be an NMOS transistor in one example. The R3 resistor may have a first end 188 coupled to a power supply voltage VCCP and a second end 192 coupled to a drain terminal 196 of the M3 transistor. A gate terminal 198 of the M3 transistor may be coupled, through the VGIDLmVt line, to both the first biasing stage 104 and the VGIDL generation stage 112. Additionally, a source terminal 194 of the M3 transistor may be coupled, through the Vcom line, to both the second biasing stage 108 and the VGIDL generation stage 112. As shown in FIG. 1, the feedback stage 116 may also provide a gate voltage (Vg) that is provided through an output 190 that is coupled to a circuit node 189 that couples the R3 resistor and the M3 transistor together.

The VGIDL generation stage 112 may include a pull-up transistor M4 coupled in series to an output transistor M2. The M2 and the M4 transistors may be a PMOS transistors in one example. Specifically, the M4 transistor may have a source terminal 186 that is coupled to the power supply voltage VCCP and a drain terminal 182 that is coupled to the M2 transistor. A gate terminal 178 of the M4 transistor may be coupled to the feedback stage 116 through the Vg line. The M2 transistor may include a source terminal 174, through which the M2 transistor is coupled to the M4 transistor. A gate terminal 170 of the M2 transistor may be coupled, through the VGIDLmVt line, to both the first biasing stage 104 and the feedback stage 116. A drain terminal 164 of the M2 transistor may be coupled, through the Vcom line, to both the second biasing stage 108 and the feedback stage 116.

As shown in FIG. 1, VGIDL generation stage 112 provides a voltage VGIDL through an output 160 that is coupled to a circuit node 154 that couples the M4 transistor and the M2 transistor together. The VGIDL generation stage 112 may additionally include a pull-down transistor M5 arranged between the VGIDL line and ground. The M5 transistor may be an NMOS transistor in one example. Specifically, the M5 transistor may have a drain terminal 150 that is connected to the VGIDL line and a source terminal 146 that is connected to VPERI, which may be the external voltage supply. Additionally, the M5 transistor may have a gate terminal 142 that is coupled to the Vcom line. Through the Vcom line, the M5 transistor may be coupled to the drain terminal 164 of the M2 transistor, as well as to the both the second biasing stage 108 and the feedback stage 116.

The feedback stage 116 may additionally be coupled to the VGIDL generation stage 112 through a capacitor 191. As shown FIG. 1, the capacitor 191 may be coupled at a first end to the output 190, which provides gate voltage Vg from the feedback stage 116. The capacitor 191 may be coupled at a second end to the circuit node 154, which provides the VGIDL voltage from the VGIDL generation stage 112. The capacitor 191 may be a Miller compensation capacitor that is added between Vg and VGIDL so as to provide stability.

The VGIDL circuit 100 is configured to provide a VGIDL voltage that is adjustable through a range of voltages having an upper end that approaches the power supply voltage VCCP. The VGIDL voltage level is generally set by the variable resistor R1, which is coupled to the M1 transistor. The variable resistor R1 setting determines a voltage level that is output from the first biasing stage 104 on the VGIDLmVt line. The VGIDLmVt voltage is received as input at the VGIDL generation stage 112 and sets the gate voltage at the M2 transistor. Based on this gate voltage, the M2 transistor provides an output voltage on the VGIDL line.

As set forth in Equations (1) through (4) below, the M1 transistor and the M2 transistor may be arranged such that voltages across these transistors substantially cancel each other in the output voltage provided on the VGIDL line. Beginning with the first biasing stage 104, it is noted that the VGIDLmVt voltage output from the first biasing stage 104 is equal to the voltage drop across the M1 transistor and the R1 resistor. This relation is given by Equation (1):

$$VGIDLmVt = VCCP - |Vgsm1| - R1 * ibias0 \quad (1)$$

The VGIDL voltage output from the VGIDL generation stage 112 is equal to the voltage on the VGIDLmVt line plus the voltage across the M2 transistor. This relation is given by Equation (2):

$$VGIDL = VGIDLmVt + |Vgsm2| \quad (2)$$

Substituting Equation 1 into Equation 2 gives a general expression for VGIDL. This relation is given by Equation 3:

$$VGIDL = VCCP - R1 * ibias0 + (|Vgsm2| - |Vgsm1|) \quad (3)$$

The M1 and the M2 transistors may be matched such that they having matching W/L ratios. In this configuration, the currents through the M1 and M2 transistors are matched. As a result, the voltage drop across the M2 transistor (Vgsm2) is substantially equal to the voltage drop across the M1 transistor (Vgsm1). Given this equivalence, Equation 3 reduces to Equation 4:

$$VGIDL = VCCP - R1 * ibias0 \quad (4)$$

Thus, as shown in Equations (1), the VGIDL circuit 100 provides a VGIDL voltage that is adjustable through a range of voltages having an upper end that approaches the power supply voltage VCCP. The VGIDL voltage level may be set by the variable resistor R1, which is coupled to the M1 transistor. For example, if ibias0=0.5 uA, then by choosing different R1, different VGIDL levels may be chosen.

The VGIDL circuit 100 additionally includes negative feedback loop features that maintain the VGIDL voltage at a desired level in the presence of various circuit loading conditions. These negative feedback loop features operate by modifying gate voltages on the M4 and M5 transistors in response to changing circuit load conditions. The M4 transistor generally operates to improve pull-up drive strength. The operation of the M4 transistor is described in greater detail below in connection with FIG. 2. The M5 transistor generally operates to improve pull-down drive strength. During normal operation, M5 here is cut-off. When VGIDL becomes too high, the M5 transistor turns on to provide extra pulldown current. The operation of the M5 transistor is described in greater detail below in connection with FIG. 3.

Figure 2:
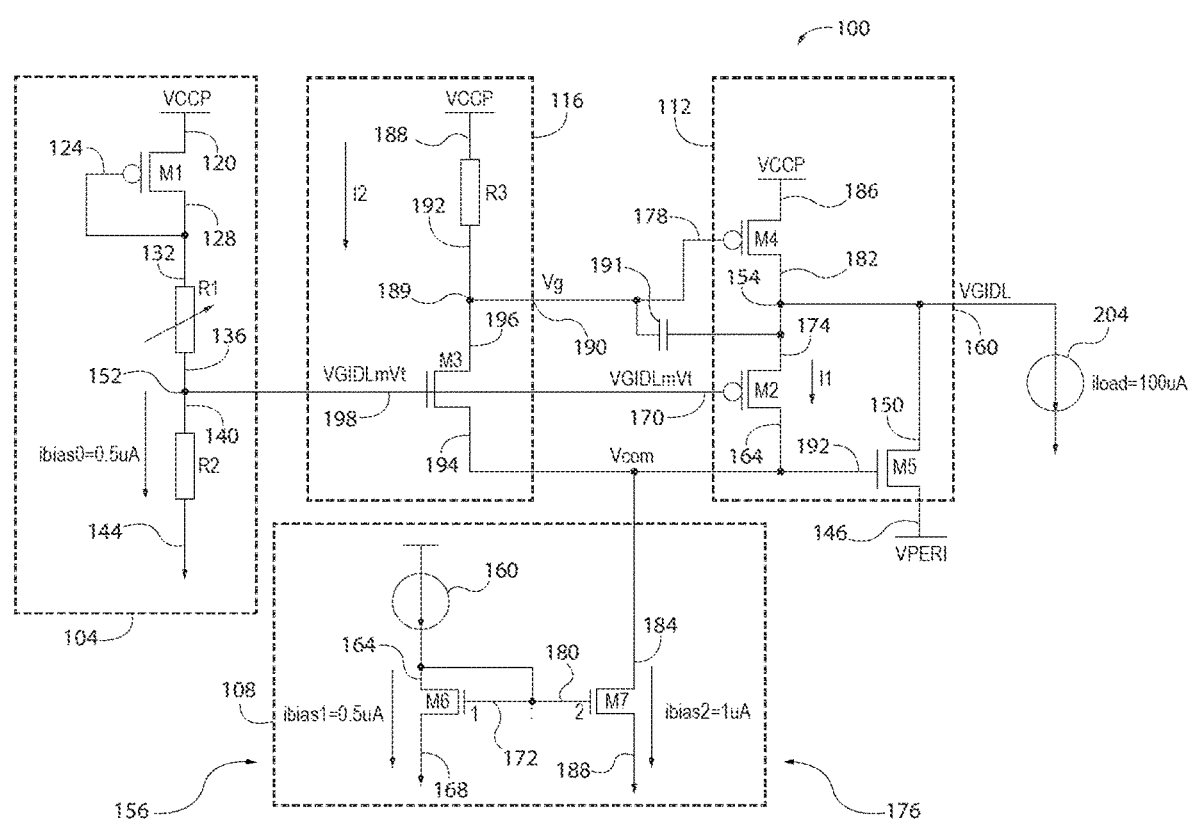
FIG. 2 is a circuit diagram that illustrates negative feedback loop features that improve pull-up drive strength for a VGIDL circuit in accordance with the present disclosure.

FIG. 2 is a circuit diagram that illustrates negative feedback loop features that improve pull-up drive strength for a VGIDL circuit 100 in accordance with the present disclosure. FIG. 2 shows the VGIDL circuit 100 of FIG. 1, including a circuit load 204 coupled to the VGIDL line. The circuit load 204 generally represents loading conditions that may be present at the output of the circuit 100 at a particular time. For example, if the VGIDL circuit is used in a memory device, the circuit load 204 may be due to a memory access circuit or other downstream memory component. FIG. 2 additionally illustrates currents in the circuit that are affected by the circuit load 204. Specifically, FIG. 2 includes a first current I1 that represents the current through the M2 resistor and a second current I2 that represents the current through the R3 resistor.

As shown in FIG. 2, when the circuit load 204 is applied, a load current (iload) is present at the output of the VGIDL circuit 100. As the circuit load 204 is applied iload increases, VGIDL is pulled lower. As VGIDL is pulled lower, the gate-to-drain voltage (Vgs) of the M2 transistor decreases. This decrease in Vgs of the M2 transistor causes I1 to decrease. The decrease in I1 causes a corresponding increase in I2. As I2 increases, the voltage drop across the R3 resistor increases. This increased voltage drop across R3 causes Vg to be pulled lower. As Vg is pulled lower, the pull-up ability of the M4 transistor is increased. The increased pull-up ability of the M4 transistor causes VGIDL to rise to a higher level or to rise back towards its steady-state value.

Figure 3:
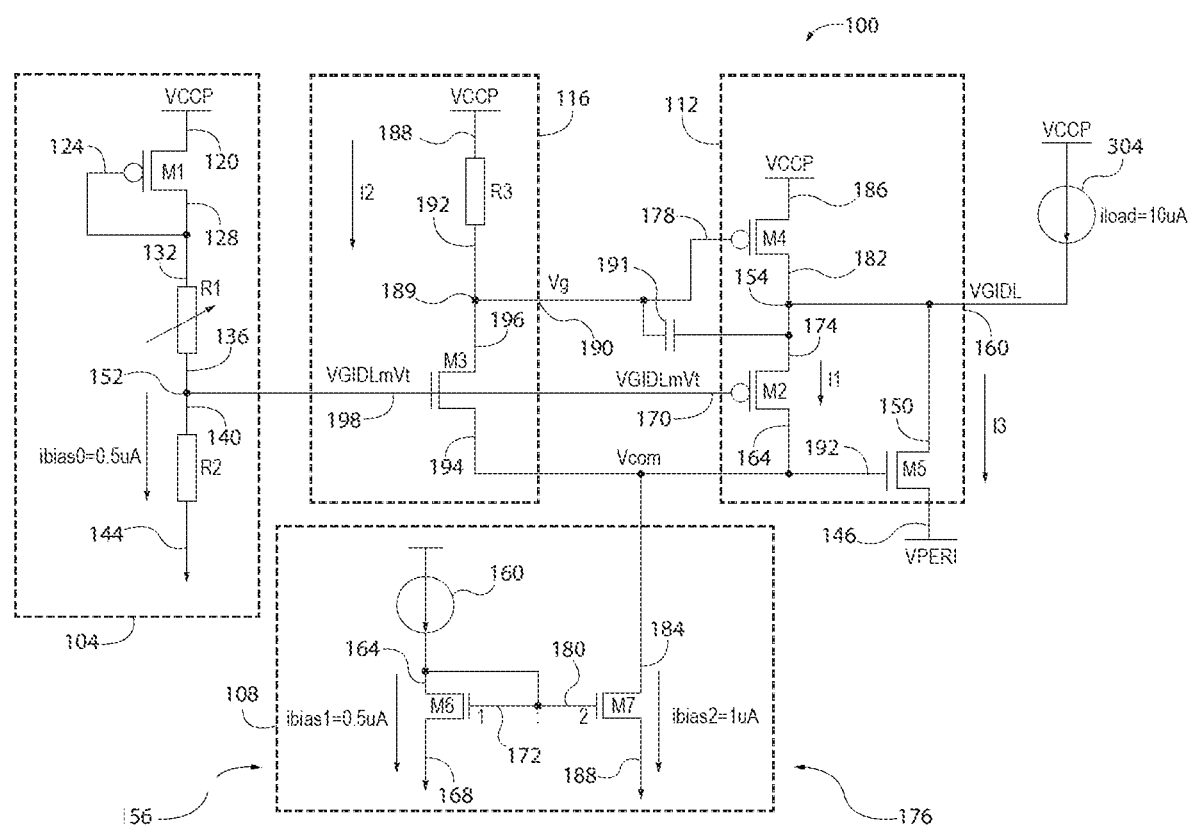
FIG. 3 is a circuit diagram that illustrates negative feedback loop features that improve pull-down drive strength for a VGIDL circuit in accordance with the present disclosure.

FIG. 3 is a circuit diagram that illustrates negative feedback loop features that improve pull-down drive strength for a VGIDL circuit 100 in accordance with the present disclosure. FIG. 3 shows the VGIDL circuit 100 of FIG. 1, including a circuit load 304 coupled to the VGIDL line. The circuit load 304 generally represents loading conditions that may be present at the output of the circuit 100 at a particular time. For example, if the VGIDL circuit is used in a memory device, the circuit load 304 may be due to a memory access circuit or other downstream memory component. FIG. 3 additionally illustrates currents in the circuit that are affected by the circuit load 304. Specifically, FIG. 3 includes a first current I1 that represents the current through the M2 transistor, a second current I2 that represents the current through the R3 resistor, and a third current I3 that represents the current through the M5 transistor.

As shown in FIG. 3, when the circuit load 304 is applied, a load current (iload) is present at the output of the VGIDL circuit 100. If the load current is less than a predetermined value, the M5 transistor is cut-off. Here, I3=0 uA. As the circuit 304 is applied and iload increases, VGIDL is pulled higher, Vcom is pulled higher, the M5 transistor turns on due to the increased voltage at its gate terminal 142. When the M5 transistor turns on, I3 increases. As I3 increases, VGIDL is pulled lower or back towards its steady state value.

Figure 4:
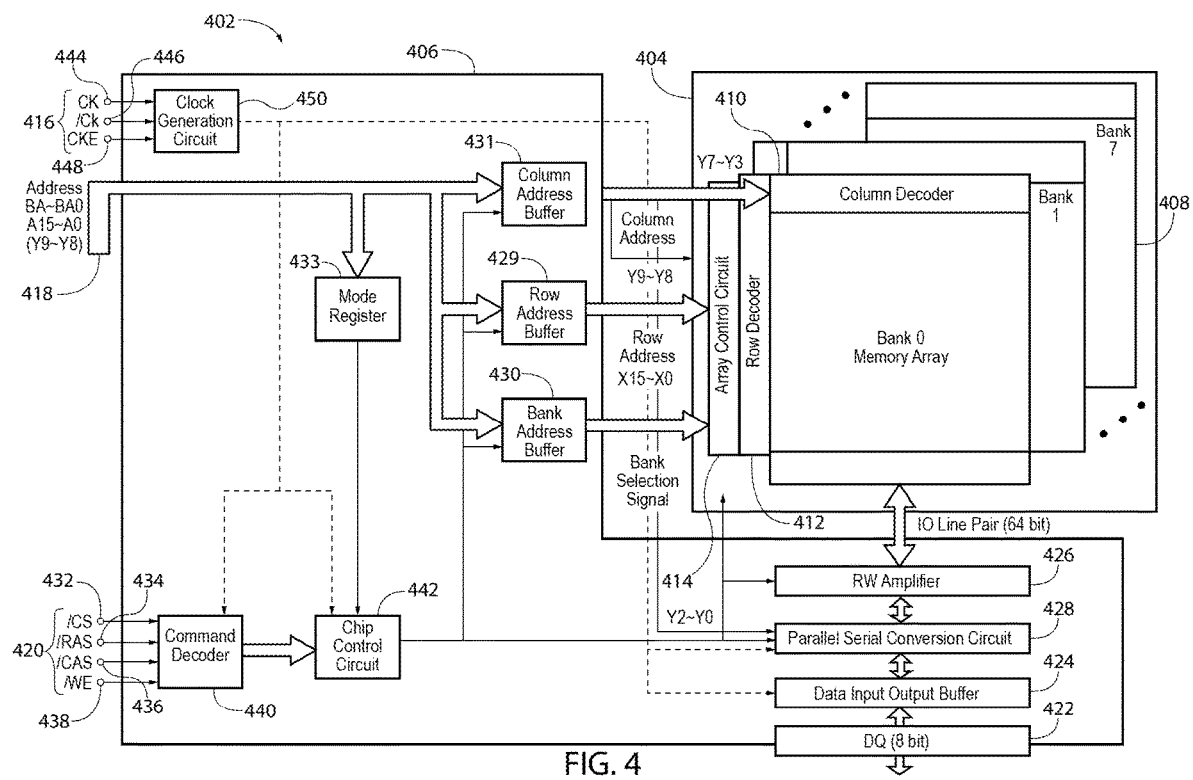
FIG. 4 is a block diagram of a memory chip that may utilize a VGIDL generation circuit in accordance with an embodiment of the present disclosure.

FIG. 4 is a block diagram of a memory chip 402 that may utilize a VGIDL generation circuit in accordance with an embodiment of the present disclosure. The following discussion initially focuses on the general operation of the memory chip 402. Following this initial discussion, use of a VGIDL generation circuit in the memory chip 402 is discussed. The memory chip 402 may be DRAM or non-volatile RAM integrated into a single semiconductor chip, for example, however, other devices may also be the memory chip 402 of the present disclosure. The memory chip 402 may be mounted on a memory module substrate, a mother board or the like (not shown). The memory chip includes a memory cell array region 404 and a peripheral circuit region 406. The memory cell array region 404 includes a memory cell array 408 including a plurality of banks, each bank including a plurality of word lines, a plurality of bit lines, and a plurality of memory cells arranged at intersections of the plurality of word lines and the plurality of bit lines. For example, a number of the plurality of banks may be eight as shown in FIG. 4. The selection of the bit line is performed by a plurality of column decoders 410 and the selection of the word line is performed by a plurality of row decoders 412. An array control circuit 414 is provided for selecting a bank of the memory cell array 408.

The peripheral circuit region 406 includes clock terminals 416, address terminals 418, command terminals 420, and data input/output (I/O) terminals (DQ) 422. For example, the data I/O terminals may handle eight-bit data communication. Data Input Output (I/O) buffers 424 are coupled to the data input/output terminals (DQ) 422 for data accesses, such as read accesses and write accesses of memories. The data accesses between the data I/O buffer 424 and the memory cell array 408 may be executed by a read/write (RW) amplifier 426 and a parallel serial conversion circuit 428 that converts between parallel data in the memory cell array region 404 and the data I/O terminal 422. Thus, the data is transferred between the RW amplifier 426 and the data I/O buffer 424.

The address terminals 418 are supplied with address signals A15-A0 and bank address signals BA0-BA2. The bank address signals may be used for selecting a bank among the plurality of banks. The bank address signals are provided to an array control circuit 414 for selecting a bank via a bank address buffer 430 as a bank selection signal. For example, there are three bank address signals BA0-BA2 which allows to select one bank among eight banks as shown in FIG. 4. In one embodiment, a row address and a column address may be provided on the address signals A15-A0 by address multiplexing. In a memory chip without additive latency and posted CAS-mode, a portion of the column address, (e.g., Y9 and Y8 in FIG. 4) may not be multiplexed, and may be supplied separately simultaneously with the row address.

The command terminals 420 may include a chip select (/CS) pin 432 for receiving a complementary CS signal, a row address strobe (/RAS) pin 434 for receiving a RAS signal, a column address strobe (/CAS) pin 436 for receiving a CAS signal, a wrote enable (ME) pin 438 for receiving a WE signal and the like. A command decoder 440 decodes command signals from the command terminals 420 to receive various commands including a read command and a write command, and provides control signals responsive to the received commands to a chip control circuit 442.

Accordingly, read data is read from a memory cell in the memory cell array 408 designated by a row address and a column address, when the read command is issued and the row address and the column address are timely supplied with the read command. The read data DQ is output from the data I/O terminals 422 via the RW amplifier 426, the parallel serial conversion circuit 428 and the data I/O buffer 424. Similarly, write data DQ is supplied to the data I/O terminals 422 via the data I/O buffer 424, the parallel serial conversion circuit 428, and the RW amplifier 426 to the memory cell array 408 and is written to the memory cell designated by a row address and a column address when the write command is issued and the row address and the column address are timely supplied with the write command.

The clock terminals 416 include clock pins CK 444 and /CK 446 and a clock enable (CKE) pin 448. The clock terminals 416 are supplied with external clock signals CK and /CK at the CK pin 444 and /CK pin 446, respectively. A clock enable (CKE) signal is supplied at the CKE pin 448 of the clock terminals 416. The CKE signal may activate or deactivate internal clock circuits, input buffers and output drivers, thus the CKE signal is part of a command. The external clock signals CK and /CK are complementary to each other and are supplied to a clock generator 450. The clock generator 450 receives the external clock signals CK and /CK and may execute phase control and generates an internal clock signal based on the received external clock signals and the CKE signal. Although not limited thereto, a DLL circuit can be used as the clock generator 416. The internal clock signal may be supplied various circuits, including the command decoder 440, the chip control circuit 442, the data I/O buffer 424, or the like. The various circuits may use the internal clock signal as a timing signal.

Figure 5:
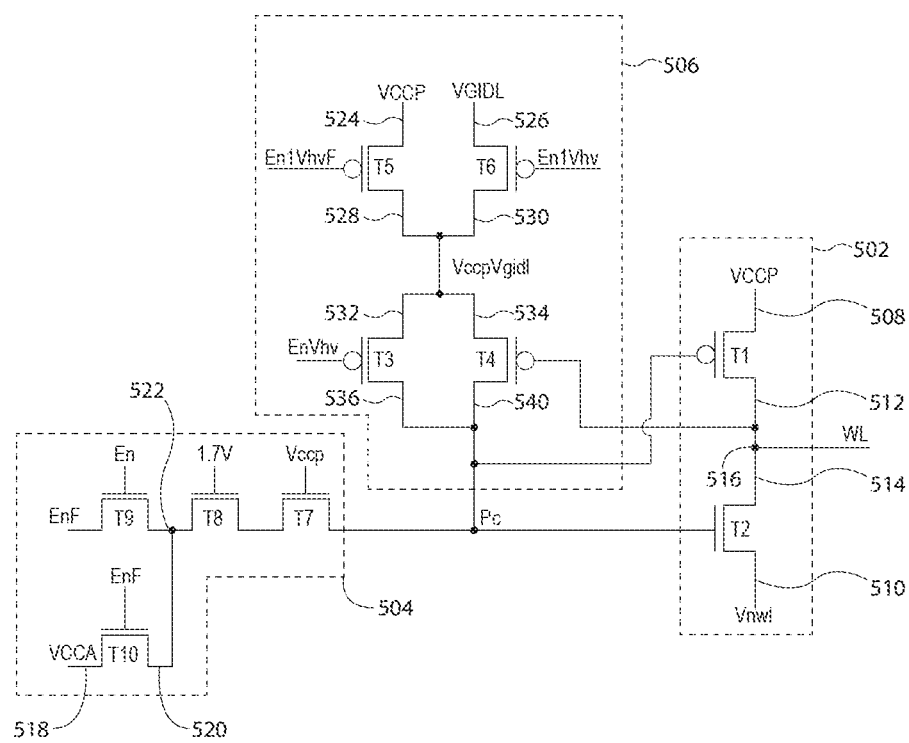
FIG. 5 is a schematic illustration of a row decoder circuit in accordance with the present disclosure.

A VGIDL generation circuit in accordance with the present disclosure may be used in connection with various components illustrated in FIG. 4. In one example, a VGIDL generation circuit may be used in connection with the row decoder 412. FIG. 5 is a schematic illustration of a row decoder circuit 500 in accordance with the present disclosure. By way of example and not limitation, the following discussion refers the row decoder circuit 500 as a component of the row decoder 412 shown in FIG. 4. The row decoder circuit 500 may be configured to use a VGIDL voltage that is provided by the VGIDL generation circuit 100 of FIG. 1. The row decoder circuit 500 includes a word line stage 502, a voltage pass-through stage 504, and a VGIDL switch stage 506.

The word line stage 502 is generally configured to pull up or pull down a particular word line WL associated with the row decoder 412. The word line stage 502 is coupled to both the voltage pass-through stage 504 and the VGIDL switch stage 506 through a circuit node Pc. The voltage pass-through stage 504 is generally configured to provide voltages that are used by the word line stage 502 to control various transistors that pull the WL voltage either up or down. The VGIDL switch stage 506 is generally configured to provide a VGIDL voltage that is used to control gate induced drain leakage (GIDL) in one or more transistors associated with the word line stage 502.

The word line stage 502 may be coupled to a word line WL associated with the row decoder 412. The word line WL may be activated or de-activated depending on the particular memory access operation executed by the row decoder 412.

As described in connection with FIG. 4, the row decoder 412 may assert the word line WL as part of a memory operation that access one or more cells of the memory cell array 408. It should be appreciated that a row decoder 412 may have a plurality of word lines. FIG. 5 includes only one word line by way of example and in order to simply the drawing.

The word line stage 502 may include a pull-up transistor T1 and a pull-down transistor T2. The T1 transistor may be proximate to a power supply voltage such that the source terminal 508 of the T1 transistor is coupled to VCCP. The T2 transistor may be proximate to a low voltage Vnwl such that the source terminal 510 of the T2 transistor is coupled to Vnwl. The drain terminal 512 of the T1 transistor and the drain terminal 514 of the T2 transistor may be coupled together through a circuit node 516. The circuit node 516 may additionally provide a coupling between the T1 and T2 transistors and the word line WL.

The voltage pass-through stage 504 may be coupled to various voltage sources that are coupled to or otherwise associated with the row decoder 412. The voltage pass-through stage 504 is generally configured to pass one of those voltages to the word line stage 502 via the Pc circuit node responsive to the state of the word line WL. The voltage pass-through stage 504 includes a coupling to VCCA, which may be the voltage provided to power the memory array 408 (shown in FIG. 4). In one example, VCCA may be 1.0 volts. The voltage pass-through stage 504 may additionally include a coupling to an enable low voltage EnF. As described in greater detail below, the EnF voltage may be used to enable various transistors and may be asserted or de-asserted depending on whether the word line WL is selected or un-selected.

The voltage pass-through stage 504 may pass one of VCCA or EnF to the Pc circuit node through the operation of a transistor network that, as shown in FIG. 5, may include transistors T7 through T10. Transistors T7 through T9 may be coupled in series (in a source to drain configuration in one example) between the EnF line and the Pc circuit node. An enable high voltage En, which is a complement of the enable low voltage EnF previously mentioned, may provide the gate voltage for the T9 transistor. A 1.7 voltage source may provide the gate voltage for the T8 transistor. VCCP may provide the gate voltage for the T7 transistor. The T10 transistor may include a source terminal 518 that, in one embodiment, couples to VCCA. The drain terminal 520 of the T10 transistor may couple to a circuit node 522 that additionally couples the T9 transistor to the T8 transistor.

The VGIDL switch stage 506 includes a transistor network that is generally configured to provide a VGIDL voltage to the word line stage 502 responsive to the state of the word line WL. The VGIDL switch stage 506 may include transistors T3 and T4, which are coupled to the Pc circuit node. The VGIDL switch stage 506 may additionally include transistors T5 and T6, which are coupled to voltage lines. In some embodiments, the VGIDL switch stage 506 may include a fuse that may be blown to enable either passing VGIDL to the word line stage 502 or passing VCCP to the word line stage 502. When the fuse is not blown, VGIDL may be passed to the word line stage 502 so as to reduce or eliminate gate induced leakage (GIDL) current as described herein.

As shown in FIG. 5, the fuse input may be received as gate voltages on the T5 and T6 transistors. The source 524 of the T5 transistor may be coupled to VCCP. The source 526 of the T6 transistor may be coupled to VGIDL. T5 and T6 transistors may be additionally coupled to a common node such that the drain 528 of the T5 transistor is coupled to the drain 530 of the T6 transistor. The gate input to the T5 transistor is labelled En1VhvF. The gate input to the T6 transistor is labelled En1Vhv. When the fuse is not blown, En1Vhv is low and En1VhvF is VCCP. Here, the T6 transistor is activated and the T5 transistor is not activated. When the fuse is blown, En1Vhv is VCCP and En1VhvF is low. Here, the T5 transistor is activated and the T6 transistor is not activated.

The node connecting the drains of the T5 and T6 transistors is labelled in FIG. 5 as VccpVgidl. This labeling reflects the fact that this voltage node may have a voltage of either VCCP or VGIDL depending on the state of the fuse input. The VccpVgidl circuit node is additionally coupled to the T3 and T4 transistors. Specifically, the VccpVgidl circuit node is coupled to the source terminal 532 of the T3 transistor and to the source terminal 534 of the T4 transistor. The T3 and T4 transistors may be additionally coupled to a common node such that the drain 536 of the T3 transistor is coupled to the drain 540 of the T4 transistor.

As shown in FIG. 5, the common node to which the drains of the T3 and T4 transistors are coupled may be the Pc circuit node. In this configuration, the T3 and T4 transistors may pass the voltage on the VccpVgidl node to the Pc circuit node depending on their gate voltages. The gate voltage on the T3 transistor may be determined by the EnVhv signal. The gate of the T4 transistor may be coupled to the circuit node 512 of the word line stage 502. Thus, the gate voltage on the T4 transistor may be determined by the state of the pull-up transistor T1 and the pull-down transistor T2.

In operation, when the word line WL is selected, the row decoder 412 asserts enable signals such that EnF is low, En is VCCA, and EnVhv is VCCP. With EnF low and En set to VCCA, the T9 transistor will be turned on. With the T9 transistor turned on, the EnF low voltage level will be passed to the Pc circuit node such that the T2 transistor will be cut-off and the T1 transistor will be turned on. Thus, the word line WL will be pulled up to VCCP. Here, the T4 transistor will also be cut-off.

When the word line WL is un-selected, the row decoder 412 asserts enable signals such that EnF is VCCA, En is low, and EnVhv is low. With EnF set to VCCA and En low, the T9 transistor will be cut-off. Here, the T10 transistor will make the Pc circuit node not lower than VCCA-Vt such that T2 is turned-on to pull the word line WL down to Vnwl. The T4 transistor is then turned-on to pass VccpVgild to the Pc circuit node. When the fuse bit is not blown, VccpVgidl is VGIDL so that the Pc circuit node is VGIDL.

Gate induced drain leakage (GIDL) is one of the major contributors to off-state leakage current and occurs at high gate voltage and low drain voltage for a transistor such as a PMOS. Through the use a VGIDL generation circuit such as described in connection with FIG. 5, GIDL may be reduced or eliminated thereby improving the operation of a memory device. In the row decoder example of FIG. 5, the pull-up transistor T1 associated to the word line stage 502 may suffer large off-state GIDL leakage in the absence of a VGIDL generation circuit. Specifically, when the array section associated with the T1 transistor is not accessed, a large voltage drop may be present across the T1 transistor leading to the presence of GIDL. The T1 transistor in the off-state may have a source voltage that is VCCP (about 3.1V in one example) and a drain voltage that is Vnwl (about −0.3V in one example). With the use of a VGIDL generation circuit as shown in FIG. 5, the T1 transistor in the off-state has a gate voltage of VGIDL rather than VCCP. VGIDL is configured to be less than VCCP and in one example is about 2.8 V. With this reduced voltage on the gate of the T1 transistor in the off-state, GIDL in the T1 transistor may be reduced thereby improving the operation of the memory device.

The above specification, examples and data provide a complete description of the structure and use of exemplary embodiments of the invention as defined in the claims. Although various embodiments of the claimed invention have been described above with a certain degree of particularity, or with reference to one or more individual embodiments, those skilled in the art could make numerous alterations to the disclosed embodiments without departing from the spirit or scope of the claimed invention. Other embodiments are therefore contemplated. It is intended that all matter contained in the above description and shown in the accompanying drawings shall be interpreted as illustrative only of particular embodiments and not limiting. Changes in detail or structure may be made without departing from the basic stages of the invention as defined in the following claims.

The foregoing description has broad application. The discussion of any embodiment is meant only to be explanatory and is not intended to suggest that the scope of the disclosure, including the claims, is limited to these examples. In other words, while illustrative embodiments of the disclosure have been described in detail herein, the inventive concepts may be otherwise variously embodied and employed, and the appended claims are intended to be construed to include such variations, except as limited by the prior art.

The invention claimed is:

1. An apparatus, comprising:
a first biasing circuit stage configured to provide a biasing voltage on a biasing signal line, the biasing voltage based on a current through a first resistor associated with the first biasing circuit stage;
a voltage generation circuit stage coupled to the first biasing circuit stage, the voltage generation circuit stage having an output transistor that is coupled to the biasing signal line through a gate terminal -of the output transistor; and
an output line coupled to the voltage generation circuit stage and configured to provide an output voltage signal having a steady-state voltage that is less than a power supply voltage by an amount that corresponds to a voltage drop across the first resistor associated with the first biasing circuit stage, wherein the output line is coupled to a source of the output transistor.

2. The apparatus of claim 1, wherein the first biasing circuit further comprises: a biasing transistor coupled between a power supply voltage and a first end of the first resistor, wherein a voltage drop across the biasing transistor substantially cancels a voltage drop across the output transistor in the output voltage provided on the output line by the voltage generation circuit stage.

3. The apparatus of claim 1, wherein the first biasing circuit further comprises: a second resistor coupled between a second end of the first resistor and ground, wherein the biasing signal line is output from the first biasing circuit stage through a circuit node that couples the first resistor to the second resistor.

4. The apparatus of claim 1, wherein the first resistor is a variable resistor and a variation in the resistance of first resistor causes a corresponding variation in the output voltage provided on the output line by the voltage generation circuit stage.

5. The apparatus of claim 1, wherein the output line is further coupled to a circuit load configured to cause a change in load current at the output line.

6. The apparatus of claim 5, wherein the voltage generation circuit further comprises a pull down transistor coupled to the output line, wherein the pull-down transistor is configured to cause the output voltage to be lowered towards the steady-state voltage when the load current is less than a predetermined value.

7. The apparatus of claim 5, wherein the voltage generation circuit further comprises a pull up transistor coupled to the output line, wherein the pull up transistor is configured to cause the output voltage to rise towards the steady-state voltage when the load current is greater than a predetermined value.

8. The apparatus of claim 5, further comprising a feedback circuit stage configured to cause the voltage generation circuit stage to adjust an output voltage in response to detection of the change in load current.

9. The apparatus of claim 8, wherein the feedback circuit stage is configured to provide a pull-up signal to the voltage generation circuit stage in response to detection of an increase in the load current and to provide a pull-down signal to the voltage generation circuit stage in response to detection of a decrease in the load current.

10. A method, comprising:
providing a biasing voltage from a first biasing circuit stage based on a current through a first resistor associated with the first biasing circuit stage;
receiving the biasing voltage signal at a voltage generation circuit stage through a biasing signal line that is coupled to a gate terminal of an output transistor that is associated with the voltage generation circuit stage;
generating an output voltage from the voltage generation circuit stage based on the biasing voltage provided by the biasing circuit stage, the output voltage having a steady-state voltage that is less than a power supply voltage by an amount that corresponds to a voltage drop across the first resistor associated with the first biasing circuit stage, wherein the output voltage is provided at a source of the output transistor; and
providing the output voltage to a load so as to control a gate-induced drain leakage current in the load.

11. The method of claim 10, further comprising:
providing current to the first resistor through a biasing transistor coupled between a power supply voltage and a first end of the first resistor, wherein a voltage drop across the biasing transistor substantially cancels a voltage drop across the output transistor in the output voltage provided on the output line by the voltage generation circuit stage.

12. The method of claim 10, further comprising:
varying a resistance of the first resistor so as to cause a corresponding variation in the output voltage provided on the output line by the voltage generation circuit stage.

13. The method of claim 10, further comprising:
generating a pull-down signal at a feedback circuit stage responsive to an increased voltage on a voltage reference that couples the feedback circuit stage to the voltage generation stage, wherein the increased voltage on the voltage reference line corresponds to an increased current in the voltage generation circuit stage that occurs due to a pull-up load current at the output line;
receiving the pull-down signal at a gate terminal of a pull-down transistor associated with the voltage generation circuit stage, the pull-down signal being received across the voltage reference line that couples the feedback circuit stage to the voltage generation stage; and
increasing a pull-down ability of the pull-down transistor responsive to the pull-down signal provided by the feedback circuit stage so as to lower the output voltage back towards the steady-state voltage responsive to a rise in the output voltage that corresponds to the pull-up load current at the output line.

14. The method of claim 10, further comprising causing the voltage generation stage to adjust a pull-up or pull-down transistor in response to detection of a change in a load current at the output line.

15. The method of claim 10, further comprising:
passing the output voltage through a word line stage of a row decoder circuit to control the gate-induced drain leakage current.

16. An apparatus, comprising:
a biasing transistor having first and second terminals, the first terminal being coupled to a power supply voltage;
a biasing resistor having first and second ends, the first end coupled to the biasing transistor and the second end coupled to a biasing voltage signal line; and
an output transistor having a gate terminal and an output terminal, the gate terminal coupled to the biasing resistor through the biasing voltage signal line, the output terminal configured to provide an output voltage;
wherein a voltage drop across the biasing transistor substantially cancels a voltage drop across the output transistor in the output voltage.

17. The apparatus of claim 16, wherein:
the biasing transistor is a PMOS transistor; and
the biasing resistor is a variable resistor.

18. The apparatus of claim 16, further comprising: a circuit load, wherein the output voltage is provided to a circuit load.

19. The apparatus of claim 16, further comprising:
a pull-up transistor coupled between the power supply voltage and the output transistor, the pull-up transistor having a gate terminal configured to receive a pull-up signal on a gate voltage signal line that couples the pull-up transistor to a feedback component;
wherein a pull-up ability of the pull-up transistor increases responsive to the pull-up signal provided by the feedback component so as to raise the output voltage back towards a steady-state voltage responsive to a drop in the output voltage that corresponds to a load current at the output terminal of the output transistor.

20. The apparatus of claim 19, wherein the pull-up transistor is a PMOS transistor.

* * * * *